United States Patent
Tseng et al.

(10) Patent No.: US 11,574,886 B2
(45) Date of Patent: Feb. 7, 2023

(54) THERMALLY CONDUCTIVE MOLDING COMPOUND STRUCTURE FOR HEAT DISSIPATION IN SEMICONDUCTOR PACKAGES

(71) Applicant: Taiwan Semiconductor Manufacturing Co., Ltd., Hsin-Chu (TW)

(72) Inventors: Chun-Hao Tseng, Taichung (TW); Ying-Hao Kuo, Hsinchu (TW); Kuo-Chung Yee, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 88 days.

(21) Appl. No.: 17/104,588

(22) Filed: Nov. 25, 2020

(65) Prior Publication Data

US 2021/0104485 A1   Apr. 8, 2021

Related U.S. Application Data

(63) Continuation of application No. 16/666,708, filed on Oct. 29, 2019, now Pat. No. 10,861,817, which is a
(Continued)

(51) Int. Cl.
*H01L 23/31* (2006.01)
*H01L 23/42* (2006.01)
(Continued)

(52) U.S. Cl.
CPC .......... *H01L 24/29* (2013.01); *H01L 21/568* (2013.01); *H01L 23/373* (2013.01);
(Continued)

(58) Field of Classification Search
CPC ....... H01L 24/29; H01L 23/373; H01L 23/42; H01L 2924/01013; H01L 2924/01029; H01L 2924/01047; H01L 2924/01079
(Continued)

(56) References Cited

U.S. PATENT DOCUMENTS 5,587,882 A    12/1996 Patel
6,323,066 B2   11/2001 Lai et al.
(Continued)

OTHER PUBLICATIONS

Non-Final Office Action dated Jul. 6, 2015 for U.S. Appl. No. 14/076,487.
(Continued)

*Primary Examiner* — Didarul A Mazumder
(74) *Attorney, Agent, or Firm* — Eschweiler & Potashnik, LLC

(57) ABSTRACT

The present disclosure, in some embodiments, relates to a semiconductor package. The semiconductor package includes a first chip and a second chip attached to a substrate. A thermal conductivity layer is attached to the first chip. A molding compound laterally surrounds the first chip, the second chip, and the thermal conductivity layer. The second chip extends from the substrate to an imaginary horizontally extending line that extends along a horizontally extending surface of the thermal conductivity layer facing away from the substrate. The imaginary horizontally extending line is parallel to the horizontally extending surface.

20 Claims, 7 Drawing Sheets

Related U.S. Application Data continuation of application No. 15/966,426, filed on Apr. 30, 2018, now Pat. No. 10,510,707, which is a continuation-in-part of application No. 14/076,487, filed on Nov. 11, 2013, now Pat. No. 9,960,099.

(51) Int. Cl.
  *H01L 23/00* (2006.01)
  *H01L 23/373* (2006.01)
  *H01L 21/56* (2006.01)
  *H01L 23/433* (2006.01)

(52) U.S. Cl.
  CPC .......... *H01L 23/3736* (2013.01); *H01L 23/42* (2013.01); *H01L 23/3128* (2013.01); *H01L 23/4334* (2013.01); *H01L 24/32* (2013.01); *H01L 24/33* (2013.01); *H01L 24/83* (2013.01); *H01L 2224/2919* (2013.01); *H01L 2224/32225* (2013.01); *H01L 2224/32245* (2013.01); *H01L 2224/33181* (2013.01); *H01L 2924/01013* (2013.01); *H01L 2924/01029* (2013.01); *H01L 2924/01047* (2013.01); *H01L 2924/01079* (2013.01)

(58) Field of Classification Search
  USPC ........ 257/713; 438/122, 125, 117, 107, 109, 438/110
  See application file for complete search history.

(56) References Cited

U.S. PATENT DOCUMENTS

| | | | |
|---|---|---|---|
| 6,472,762 | B1 | 10/2002 | Kutlu |
| 6,909,176 | B1 | 6/2005 | Wang et al. |
| 8,648,456 | B1 | 2/2014 | Mahler et al. |
| 2003/0115739 | A1 | 1/2003 | Fitzgerald et al. |
| 2003/0178730 | A1 | 9/2003 | Rumer et al. |
| 2005/0146021 | A1* | 7/2005 | Edwards ................. H01L 23/42 257/E23.101 |
| 2005/0224955 | A1 | 10/2005 | Desai et al. |
| 2005/0227409 | A1 | 10/2005 | Su et al. |
| 2006/0032622 | A1 | 2/2006 | Yen et al. |
| 2007/0001292 | A1 | 1/2007 | Ohta et al. |
| 2008/0029869 | A1 | 2/2008 | Kwon et al. |
| 2009/0096087 | A1 | 4/2009 | Sauciuc et al. |
| 2009/0244867 | A1* | 10/2009 | Bahadur ................. H01L 21/56 361/783 |
| 2010/0181665 | A1* | 7/2010 | Casey ................... H01L 23/433 257/723 |
| 2010/0193942 | A1 | 8/2010 | Railkar et al. |
| 2010/0220446 | A1 | 9/2010 | Tabei et al. |
| 2010/0283143 | A1 | 11/2010 | Liu et al. |
| 2011/0037155 | A1 | 2/2011 | Pagaila |
| 2011/0083836 | A1 | 4/2011 | Kobayashi |
| 2011/0151624 | A1 | 6/2011 | Xu et al. |
| 2011/0156236 | A1 | 6/2011 | Ma |
| 2011/0233756 | A1 | 9/2011 | Khandekar et al. |
| 2012/0025367 | A1 | 2/2012 | Imaizumi et al. |
| 2012/0279760 | A1 | 11/2012 | Sun |
| 2013/0217188 | A1 | 8/2013 | Wang et al. |
| 2013/0273694 | A1* | 10/2013 | Hsieh .................... H01L 23/427 257/E21.606 |
| 2014/0134803 | A1 | 5/2014 | Kelly et al. |
| 2014/0239479 | A1 | 8/2014 | Start |
| 2014/0264799 | A1* | 9/2014 | Gowda ............. H01L 23/49568 438/122 |
| 2014/0353816 | A1 | 12/2014 | Yap et al. |
| 2015/0001701 | A1 | 1/2015 | Li et al. |
| 2015/0084178 | A1 | 3/2015 | Kim et al. |

OTHER PUBLICATIONS

Non-Final Office Action dated Jan. 4, 2016 for U.S. Appl. No. 14/076,487.
Final Office Action dated Apr. 29, 2016 for U.S. Appl. No. 14/076,487.
Non-Final Office Action dated Jan. 12, 2017 for U.S. Appl. No. 14/076,487.
Final Office Action dated Jul. 27, 2017 for U.S. Appl. No. 14/076,487.
Notice of Allowance dated Dec. 27, 2017 for U.S. Appl. No. 14/076,487.
Notice of Allowance dated Sep. 26, 2019 for U.S. Appl. No. 15/966,426.
Non-Final Office Action dated May 19, 2020 for U.S. Appl. No. 16/666,708.
Notice of Allowancve dated Aug. 31, 2020 for U.S. Appl. No. 16/666,708.

* cited by examiner

THERMALLY CONDUCTIVE MOLDING COMPOUND STRUCTURE FOR HEAT DISSIPATION IN SEMICONDUCTOR PACKAGES

REFERENCE TO RELATED APPLICATIONS

This application is a Continuation of U.S. application Ser. No. 16/666,708, filed on Oct. 29, 2019, which is a Continuation of U.S. application Ser. No. 15/966,426, filed on Apr. 30, 2018 (now U.S. Pat. No. 10,510,707, issued on Dec. 17, 2019), which is a Continuation-in-Part of U.S. application Ser. No. 14/076,487, filed on Nov. 11, 2013 (now U.S. Pat. No. 9,960,099, issued on May 1, 2018). The contents of the above-referenced patent applications are hereby incorporated by reference in their entirety.

BACKGROUND

Poor heat dissipation is a common issue for microelectronics device packages. Semiconductor chips, especially those with high thermal design power (TDP) requirements can result in localized overheating that can be deleterious to product yield, performance and reliability of the resulting microelectronics device packages. A thermal management device, such as a heat sink, is typically placed on the backside of wafers for heat to be transported through a molding compound encapsulating a surface of the wafer to the surrounding environment. However, the molding compound, which is typically a mixture of an epoxy and a silica filler, has a low thermal conductivity that is generally in the range of 0.6 W/m-K to 0.8 W/m-K. This can make the molding compound a barrier to heat dissipation.

For some processes where the thermal management device is attached to the wafer, a back-side grinding process is needed to reduce the thickness of the molding compound. However, such grinding process may cause the molding compound to become undone or delaminated from the wafer to which it is attached. Where this has occurred, the edges of chips of the wafer may be susceptible to cracking, chipping and/or exposed to corrosive environmental influences during a subsequent die cutting process and associated handling.

BRIEF DESCRIPTION OF DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are intended for illustration.

Figure 1:
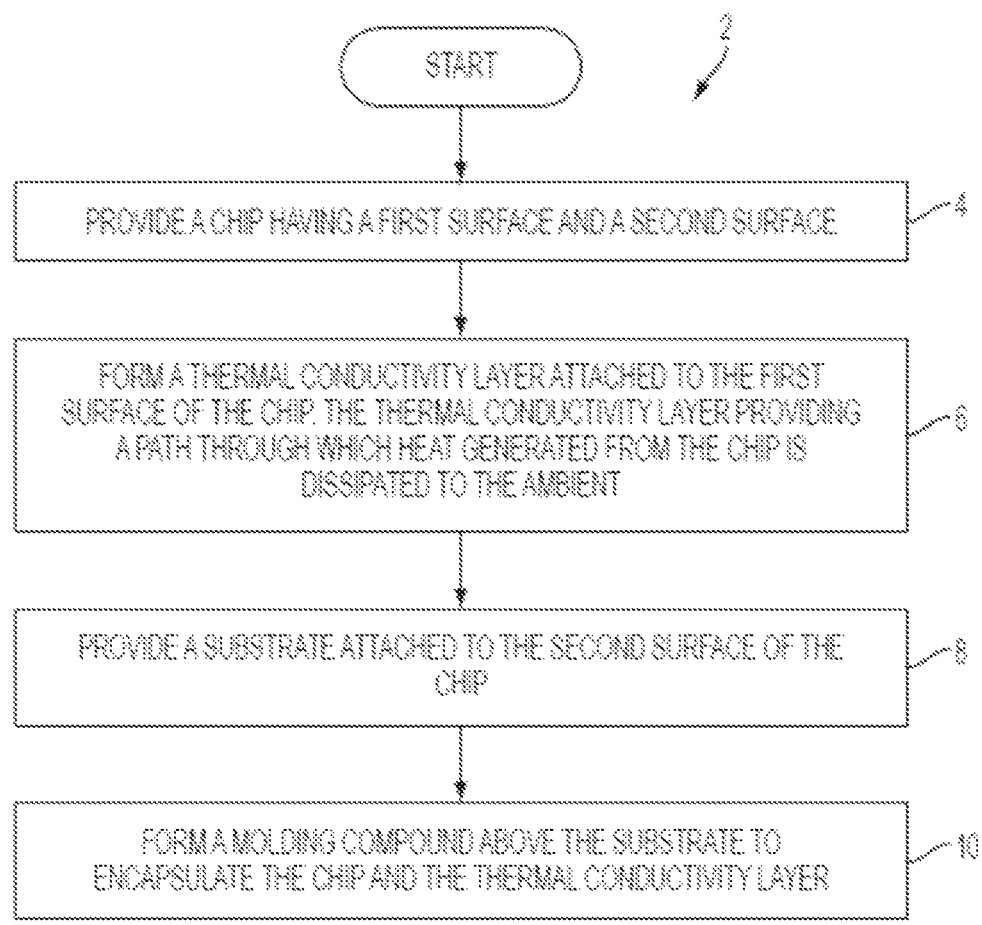
FIG. 1 is a flowchart of a method of fabricating a semiconductor package, according to one or more embodiments of the present disclosure.

FIG. 1 is a flowchart of a method 2 of fabricating a semiconductor package according to various aspects of the present disclosure. Referring to FIG. 1, the method 2 includes block 4, in which a chip is provided having a first surface and a second surface. The method 2 includes block 6, in which a thermal conductivity layer is formed attached to the first surface of the chip. The thermal conductivity layer provides a path through which heat generated from the chip is dissipated to the surrounding environment to prevent chip overheating. The method 2 includes block 8, in which a substrate is provided. The substrate is attached to the second surface of the chip. The method 2 includes block 10, in which a molding compound is formed above the substrate to encapsulate the chip and the thermal conductivity layer.

In some embodiments, additional processes are performed before, during, or after the blocks 4-10 shown in FIG. 1 to complete the fabrication of the semiconductor package, but these additional processes are not discussed herein in detail for the sake of simplicity.

FIGS. 2-10 are cross-sectional side views of portions of a semiconductor package at various stages of fabrication according to one or more embodiments of the method 2 of FIG. 1. FIGS. 2-10 have been simplified for a better understanding of the inventive concepts of the present disclosure. It should be appreciated that the materials, geometries, dimensions, structures, and process parameters described herein are exemplary only, and are not intended to be, and should not be construed to be, limiting. Many alternatives and modifications will be apparent to those skilled in the art, once informed by the present disclosure.

Figure 2:
FIG. 2 is a cross-sectional view of semiconductor packages after wafer singulation, according to one or more embodiments of the present disclosure.

Referring to FIG. 2, a first chip 100 is provided. First chip 100 is a heat sensitive chip such as a memory chip, logic chip, processor chip, or the like. A thermal conductivity layer 120 is attached to a surface of first chip 100 by an optional adhesive layer 110. In some embodiments, the adhesive layer 110 comprises one or more of an adhesive bonding, tape bonding, resin bonding, or other suitable material.

The thermal conductivity layer 120 is attached on top of first chip 100 to provide a high degree of heat dissipation by providing a thermal path through which thermal energy, or heat that is generated by first chip 100, is dissipated to the surrounding environment. The higher thermal conductivity enables the thermal conductivity layer 120 to function as an integrated heat spreader to dissipate heat from first chip 100. In addition to thermal management, the thermal conductivity layer 120, in some embodiments, is also configured to provide mechanical support during a molding process to minimize shrinkage and/or warping of a molding compound supplied during the molding process. In one or more embodiments, thermal conductivity layer 120 is capable of being used in an integrated circuit packaging type or technology, including, but not limited to, wire bonded packages, flip chip molded matrix array packages (FCMMAP), and other packages that couple an integrated circuit die to second level interconnects such as a ball grid array, a land grid array, and/or a pin grid array.

In accordance with various embodiments of the present disclosure, the thermal conductivity layer 120 has a thermal conductivity that is high enough to provide sufficient passive cooling for the integrated circuit package. For instance, in some embodiments of the present disclosure, the thermal conductivity layer 120 has a thermal conductivity between about 3 W/m-K and about 10 W/m-K. In some embodiments, depending on the specific materials used in the thermal conductivity layer 120, the thermal conductivity of the thermal conductivity layer 120 is higher than 10 W/m-K.

In one or more embodiments, the thermal conductivity layer 120 comprises a metal, such as copper, copper alloy, aluminum, gold or other suitable metals deposited on first chip 100. In some embodiments, the thermal conductivity layer 120 is deposited on the first chip 100 by an electrochemical plating (ECP) process and/or a sputtering technique. In an ECP process, the thermal conductivity layer 120 is, for example, blanket deposited on the first chip 100. In some embodiments, depending on chip size, chip spacing and the technology employed, the thickness of the thermal conductivity layer 120 ranges from about 0.5 microns to about 300 microns. An exemplary ECP process involves an electroplating composition having current density of about 3 $A/cm^2$ to about 60 $A/cm^2$. In some embodiments, the plating bath includes any combination of $CuSO_4$, HCl, $H_2SO_4$, suppressor(s) and additives. In some embodiments, the ECP solution is maintained at a temperature of about 20° C. to about 40° C. and a pH in the range of about 1-7. The current density of the ECP solution is about 3 $A/cm^2$ to about 60 $A/cm^2$. According to various embodiments, the ECP process is continued for a specified duration of time or until the first chip 100 is covered with the thermal conductivity layer 120. In some embodiments, the duration and the intensity of the ECP process are adjustable on demand.

In various embodiments, a sputtering process, such as a copper sputtering process, is used to deposit the thermal conductivity layer 120 on first chip 100. Sputtering is also known as physical vapor deposition (PVD). Although a PVD method is capable of forming a copper or copper alloy layer without introducing impurities, PVD typically has a lower deposition rate than an ECP process.

In one or more embodiments, the thermal conductivity layer 120 is deposited by chemical vapor deposition (CVD), plasma-enhanced CVD (PECVD), atomic layer deposition (ALD), evaporation, and/or other suitable processes.

In some embodiments, the thermal conductivity layer 120 is a thermally conductive adhesive layer that includes a conductive filler material comprising one of more of silver (Ag), copper (Cu), gold (Au), aluminum (Al), solder, carbon related materials such as carbon nanotubes, carbon fibers, graphite, combinations of these or other conductive materials. The use of a thermally conductive filler material substantially increases the overall thermal conductivity of the adhesive layer. Carbon nanotubes, for example, used in connection with an adhesive tape type material are capable of being arranged in the tape using a variety of approaches.

In some embodiments, carbon nanotubes are grown in a generally vertical direction from a material used in the tape. Catalyst material is arranged where growth is desirable, and a carbon-containing gas is introduced to the catalyst material. Carbon nanotubes are grown extending generally away from the catalyst material. After growth, the area around the carbon nanotubes is filled with base material including, for example, one or more adhesives, compliant plastics, and insulative material. Surfaces of the tape are arranged with an adhesive, using for example, an adhesive base material and/or adding an adhesive material at the surface.

In some embodiments, the thermal conductivity layer 120 comprises a variety of adhesives and/or structures. For example, in embodiments that involve a flexible tape type material, the base material of the thermal conductivity layer 120 is a generally flexible material. In some embodiments, the base material includes one or more of plastics, adhesives, glues, epoxies, polymers, thermoplastics, silicone, grease, oil, resin, and the like.

In some embodiments, the thermal conductivity layer 120 is deposited on the first chip 100 by one or more of a dispense or blade process. In a dispense process, for example, a material of the thermal conductivity layer 120 is dissolved in a solvent such as, for example IPA, acetone, NMP, or otherwise melted to obtain a viscosity in the range from about 1,000 cps to about 10,000 cps. The liquid or melted material of the thermal conductivity layer 120 is placed in a container, such as a syringe which is then squeezed out onto the first chip 100 by applying a pushing pressure of about 10 psi to about 500 ps. The material of the thermal conductivity layer 120 is thereafter subjected to a thermal baking process having a temperature of about 100° C. to about 150° C. to remove residue solvent and solidify the thermal conductivity layer 120 on the first chip 100.

In a blade process, for example, a material of the thermal conductivity layer 120 is dissolved in a solvent such as, for example IPA, acetone, NMP or other suitable solvent that provides good solubility to obtain a viscosity in the range from about 1,000 cps to about 10,000 cps. The liquid or melted material of the thermal conductivity layer 120 is placed in a container that combines with a roller and a solid or flexible metal sheet, for example. Through a rolling process, the roller lays out the melted material of the thermal conductivity layer 120 onto a surface of the first chip 100.

In some embodiments, the thermal conductivity layer 120 comprises a polymer material having a conductive filler material. In some embodiments, the conductive filler material is a material having a relatively high thermal conductivity that is compatible with the polymer. Unlike conventional polymer material, the use of a thermally conductive filler material substantially increases the overall thermal conductivity of the polymer material. In some embodiments, the thermally conductive filler material comprises alumina. Alumina has a thermal conductivity that is approximately 30 W/m-K. In some embodiments, the weight percentage of alumina in the polymer material ranges from about 30% to about 99%. In one or more embodiments, the weight percentage of alumina in the polymer material ranges from about 70% to about 95%. Using alumina as the filler material increases the overall thermal conductivity of the thermal conductivity layer 120 to a value that falls within the range provided above (i.e., 3 W/m-K to 10 W/m-K). This is a substantial improvement over the 0.6 W/m-K to 0.8 W/m-K thermal conductivity associated with many polymers.

In some embodiments, alternate filler materials with high thermal conductivity are used in the polymer material in addition to, or as an alternative of, alumina. For example, in some embodiments, one or more of aluminum nitride having a thermal conductivity of around 180 W/m-K, beryllium oxide having a thermal conductivity of around 260 W/m-K, various metallic solids such as aluminum (Al), copper (Cu), silver (Ag), gold (Au), AlN, $Al_2O_3$, other suitable metals and/or non-metallic solids such as diamond, silicon, and silicon carbide, solder materials such as tin, lead, copper, antimony, silver, carbon nanotubes, graphite, or the like are used in the polymer as filler material. In some embodiments, a combination of two or more of the above described filler materials are used as the filler material, such as a combination of two or more of alumina, aluminum nitride, beryllium oxide, and carbon nanotubes.

One skilled in the art understands that alternate filler materials having high thermal conductivities that are not specifically listed here may be used in accordance with implementations of the present disclosure. In at least some embodiments, a filler material having a relatively high thermal conductivity that is compatible with the polymer material is used. In some embodiments, the weight percentage of the filler material in the polymer material may range from 30% to 99%, more preferably from 70% to 95%.

In some embodiments, thermal conductivity layer 120 is formed by a molding process before being placed on first chip 100. The molding process, in some embodiments, comprises forming the thermal conductivity layer 120 by supplying a polymer material in a liquid or sheeted form. In various embodiments, to prevent bubbles from forming in a subsequent compression process, the polymer material subjected to a vacuum process in which a vacuum is pumped down to a value of about 0.01 Torr to about 10 Torr. Then in the compression process, the polymer material is subjected to a compression force of about 1 $kg/cm^2$ to about 10 $kg/cm^2$ for a time of about 1 to about 30 minutes at a temperature from about 50° C. to about 200° C. After the compression process, a post mold cure (PMC) process is applied to fully cure the polymer material. In the PMC, the polymer material is subjected to a hot plate or oven, for example at a temperature of about 100° C. to about 200° C. for a process time of about 0.1 hour to about 20 hours. Once the molding process is completed, the polymer material forms thermal conductivity layer 120 that is thereafter placed on first chip 100.

In some embodiments, after the thermal conductivity layer 120 is placed on the first chip 100, the thermal conductivity layer 120 and the first chip 100 are together subjected to a singulation process. The first chip 100 is affixed to a dicing tape or a die frame (not shown) where the first chip 100 and the thermal conductivity layer 120 are die cut or diced along cutting lines to separate the package of the first chip 100 and the thermal conductivity layer 120 into individual units. Each individual unit has a portion of the thermal conductivity layer 120 attached to first chip 100a by adhesive layer 110. In various embodiments, the individual units are formed by other methods in addition to or as an alternative of a die cutting process.

Figure 3:
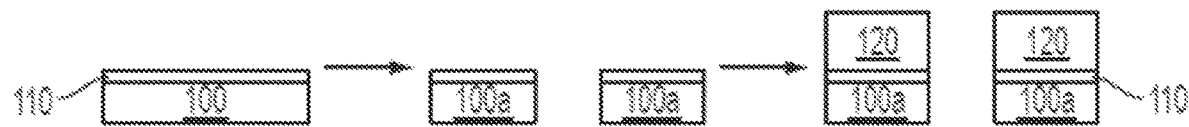
FIG. 3 is a cross-sectional view of semiconductor packages after wafer singulation, according to one or more embodiments of the present disclosure.

FIG. 3 illustrates the thermal conductivity layer 120 being placed on top of first chip 100a after singulation, in accordance with one or more embodiments.

Figure 4:
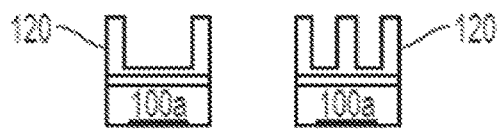
FIG. 4 is a cross-sectional view are semiconductor packages having different shapes of thermal conductivity layers, according to one or more embodiments of the present disclosure.

FIG. 4 illustrates individual units having the first chips 100a and the thermal conductivity layer 120, wherein the thermal conductivity layer 120 is formed having different shapes first chips 100a, according to various embodiments.

Figure 5:
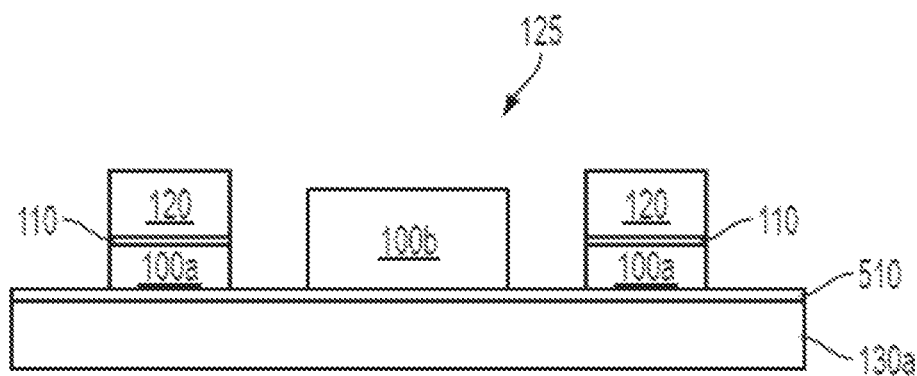
FIGS. 5-8 are cross-sectional views of a portion of a semiconductor package at various stages of fabrication according to one or more embodiments of the present disclosure.

FIG. 5 is a cross-sectional view of a portion of the semiconductor package 125 having thermal conductivity layers 120 formed on first chips 100a at a stage of fabrication according to one or more embodiments of the present disclosure. FIG. 5 shows a first substrate 130a. The semiconductor package includes a first substrate 130a. In some embodiments, the first substrate 130a is a wafer carrier. First substrate 130a has first chips 100a attached to a surface thereto by a substrate adhesive layer 510. In some embodiments, the substrate adhesive layer 510 comprises a same material as the adhesive layer 110. In other embodiments, the substrate adhesive layer 510 comprises a different material than the adhesive layer 110. Attached to first chips 100a are thermal conductivity layers 120. First substrate 130a acts as a temporary support substrate or carrier to facilitate wafer handling, transport, and processing. First substrate 130a comprises a combination of a silicon substrate, a glass substrate, a polymer substrate, a polymer-based composite substrate, a thick tape, or other suitable material. First substrate 130a, in some embodiments, is a rigid carrier configured to reduce wafer warping and/or to prevent wafer breakage that often occurs during handling and processing.

In some embodiments, a second chip 100b is attached to first substrate 130a. Second chip 100b comprises any of memory chips, RF (radio frequency) chips, logic chips, or similar chips that are not temperature sensitive or prone to overheating like first chips 100a.

A molding compound 140 is formed over first substrate 130a and encapsulates the thermal conductivity layers 120, first chips 100a, and second chips 100b. The molding compound 140 is configured to provide package stiffness, a protective or hermetic cover, shielding, and/or provide a heat conductive path to prevent chip overheating. Molding compound 140 comprises any material such as epoxy, epoxy with thermally conductive filler materials, organic cylinders, plastic molding compound, plastic molding compound with fiber, or other suitable material. In some embodiments, molding compound 140 is formed by a spin-on coating process, an injection molding process, and/or the like.

Figure 6A:
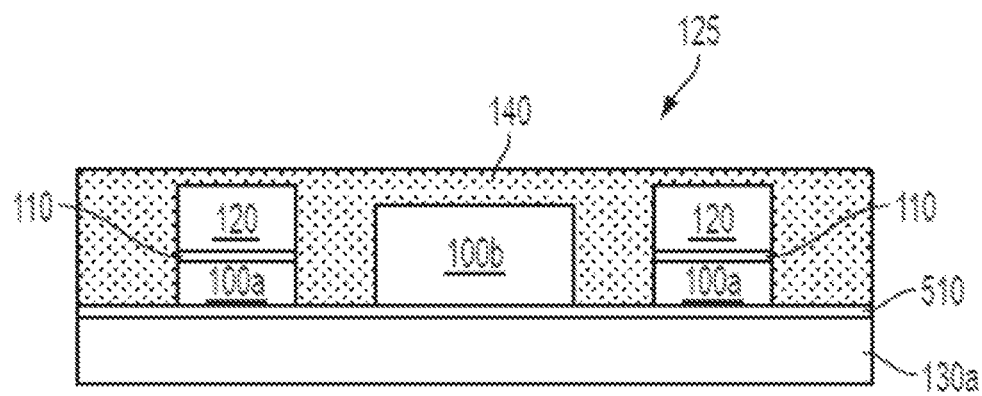

FIG. 6a is a cross-sectional view of the semiconductor package 125, after the molding compound 140 is formed on first substrate 130a, and the molding compound 140 is planarized, in accordance with one or more embodiments. In some embodiments, the molding compound 140 is planarized by a chemical mechanical polishing (CMP) process, for example. Mechanical grinding processes such as CMP sometimes cause damage to the semiconductor package 125. Accordingly, in some embodiments, a method less likely to cause damage such as, for example, wet chemical etching, dry chemical etching, dry polishing, plasma etching, or other suitable etching processes is used to planarize the molding compound 140.

Figure 6B:
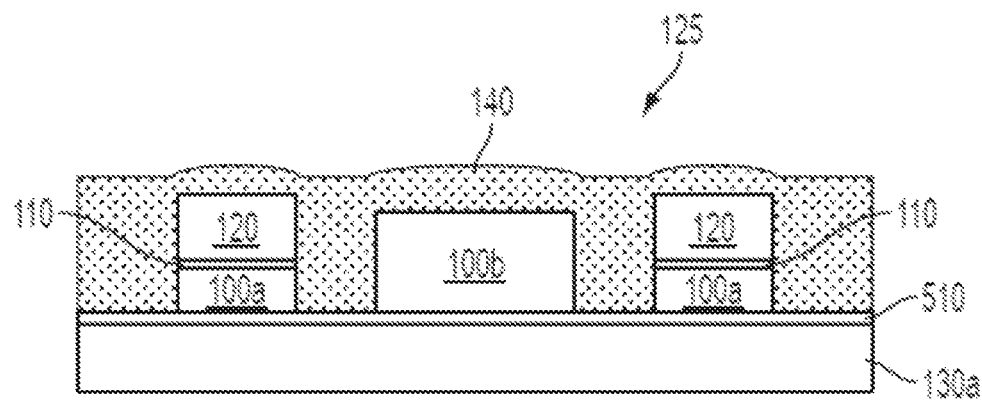

FIG. 6b is a cross-sectional view of the semiconductor package 125 having the molding compound 140 formed over first substrate 130a by a sheet lamination process, in accordance with one or more embodiments. Unlike a spin-on coating process, for example, a sheet lamination process makes it possible to eliminate backside grinding because the uniformity and film thickness of the sheets is controllable.

Figure 7:
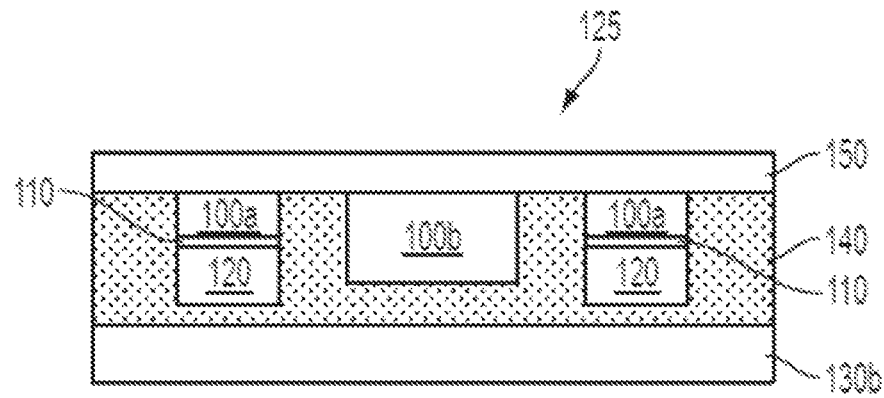

FIG. 7 is a cross-sectional view of the semiconductor package 125 in an inverted position, having been flipped following a planarization process, in accordance with one or more embodiments. The semiconductor package 125 is flipped over so that the molding compound 140 side of the package is bonded to a second substrate 130b. In some embodiments, second substrate 130b is a wafer carrier. In some embodiments, the semiconductor package 125 is released from the first substrate 130a and the chip side of the semiconductor package 125 is bonded to a package substrate 150. In other embodiments, the first substrate 130a remains attached to the semiconductor package 125 to become the package substrate 150. In some embodiments, package substrate 150 has formed therein any of several additional microelectronic layers such as RDLs (redistribution layers) and microelectronic materials such as conductor materials, semiconductor materials, and dielectric materials. In some embodiments, package substrate 150 also includes active and passive devices (not shown).

Figure 8:
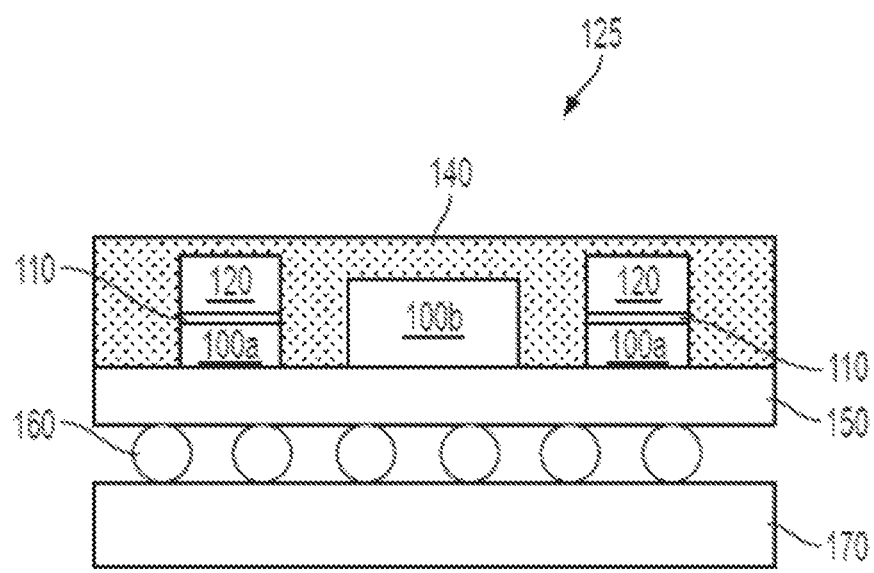

FIG. 8 is a cross-sectional view of the semiconductor package 125 having been released from the second substrate 130b, in accordance with one or more embodiments. The semiconductor package 125 is mounted onto a board 170, such as a printed circuit board (PCB) by electrical connectors 160, such as ball grid array (BGA). In some embodiments, the electrical connectors 160 comprise lead free solder or the like.

Figure 9:
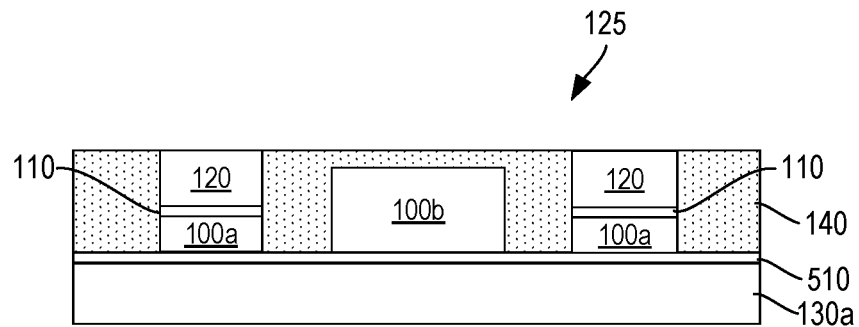
FIGS. 9-11 are cross-sectional views of a portion of a semiconductor package at various stages of fabrication according to one or more embodiments of the present disclosure.

FIG. 9 is a cross-sectional view of a portion of a semiconductor package 125 at a stage of fabrication, in accordance with one or more embodiments. Referring back to FIG. 6a, after forming the molding compound 140 over first substrate 130a, the molding compound 140 is planarized by a chemical mechanical polishing (CMP) process, for example to remove the molding compound 140 to expose the thermal conductivity layer 120, as shown in FIG. 9. In some embodiments, mechanical grinding processes such as CMP often cause damage to the semiconductor package 125. Accordingly, in some embodiments, a method less likely to cause damage such as, for example, wet chemical etching, dry chemical etching, dry polishing, plasma etching, or other suitable etching processes is used to planarize the molding compound 140. By exposing thermal conductivity layers 120, heat generated by the chips is directly and/or efficiently dissipated to the ambient or to a heat sink as heat does not need to go through a molding compound, a barrier to heat dissipation.

Figure 10:
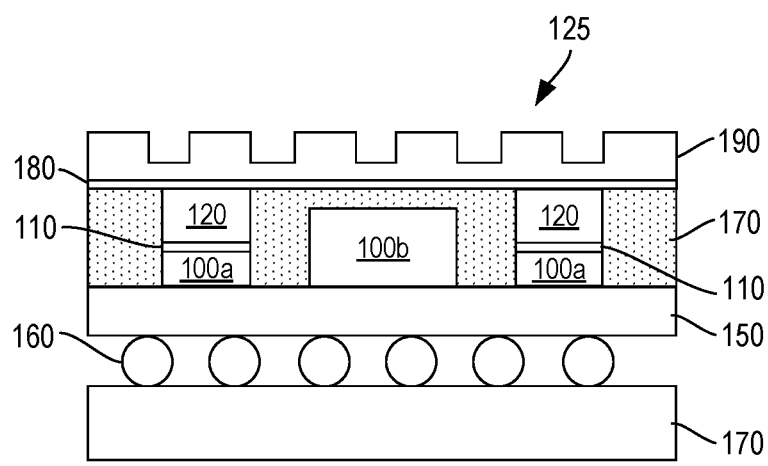
Figure 11:
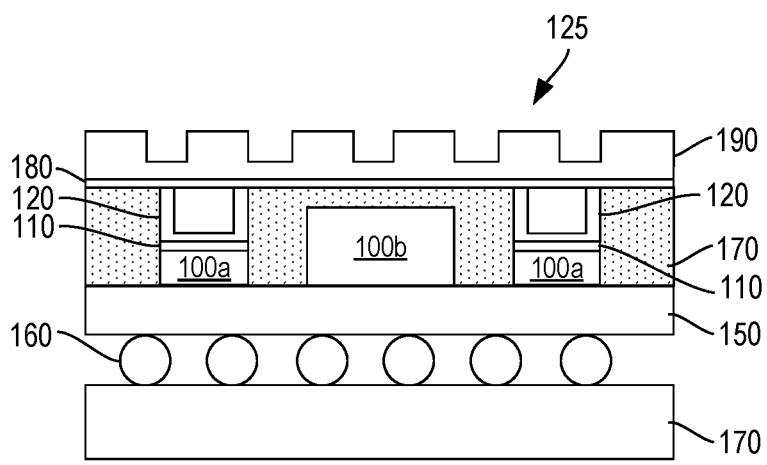

FIG. 10 is a cross-sectional view of a portion of the semiconductor package 125 having been released from the first semiconductor 130a, in accordance with one or more embodiments. The chip side of the semiconductor package 125 is bonded to the package substrate 150. Package substrate 150 has formed therein any of several additional microelectronic layers such as RDLs (redistribution layers) and microelectronic materials such as conductor materials, semiconductor materials, and dielectric materials. Package substrate 150 also includes, in some embodiments, active and passive devices (not shown). A thermal interface material (TIM) 180 is dispensed on top of the thermal conductivity layer 120, molding compound 140 and second chip 100b. In some embodiments, shown in FIG. 11, the thermal conductivity layer 120 may have a recess within an upper surface facing the TIM 180, as described above in FIG. 4. In some embodiments (not shown), upper surfaces of the thermal conductivity layer may have different shaped recesses and/or a different numbers of recesses over different chips. The different shaped recesses and/or different number of recesses allows for different amounts of heat to be dissipated from the different chips. In some embodiments, TIM 180 comprises a thermally conductive and electrically insulative material, such as an epoxy, like an epoxy mixed with a metal like silver or gold, a "thermal grease," a "white grease," other suitable material, or a combination thereof. In some embodiments, a thermal management device 190 such as a heat sink is placed on the TIM 180 to facilitate the dissipation of heat from first chips 100a and second chip 100b. In some embodiments, the semiconductor package 125 is mounted onto board 170, such as a printed circuit board (PCB) by electrical connectors 160, such as ball grid array (BGA). In some embodiments, the electrical connectors 160 comprise lead free solder or the like.

FIGS. 12-16 are cross-sectional views of a portion of a semiconductor package at various stages of fabrication according to one or more alternative embodiments of the present disclosure.

Figure 12:
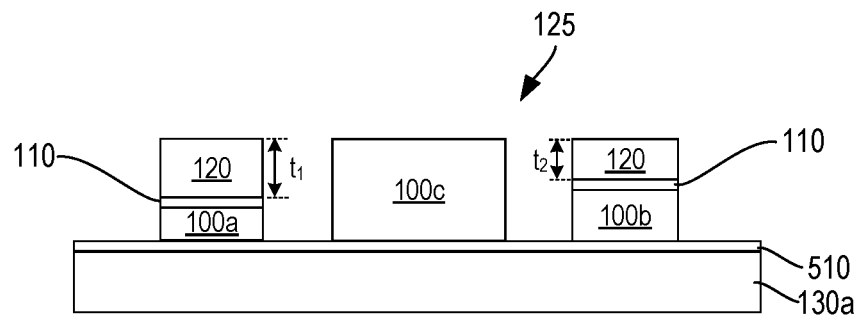
FIGS. 12-16 are cross-sectional views of a portion of a semiconductor package at various stages of fabrication according to one or more alternative embodiments of the present disclosure.

FIG. 12 is a cross-sectional view of a portion of the semiconductor package 125 having a thermal conductivity layer 120 formed on a first chip 100a and a second chip 100b at a stage of fabrication according to one or more embodiments of the present disclosure. The thermal conductivity layer 120 is not formed on a third chip 100c. The semiconductor package 125 includes a first substrate 130a. The first substrate 130a has the first chip 100a, the second chip 100b, and the third chip 100c attached to a surface thereto by a substrate adhesive layer 510.

The thermal conductivity layer 120 above the first chip 100a has a first thickness $t_1$, while thermal conductivity layer 120 above the second chip 100b has a second thickness $t_2$ that is different than the first thickness $t_1$. In some embodiments, first thickness $t_1$ is greater than second thickness $t_2$. In some embodiments, top surfaces of the thermal conductivity layer 120 over the first chip 100a, the thermal conductivity layer 120 over the second chip 100b, and the third chip 100c are substantially planar. In other embodiments (not shown), top surfaces of the thermal conductivity layer 120 over the first chip 100a and the thermal conductivity layer 120 over the second chip 100b may be higher (i.e., further from the first substrate 130a) than a top surface of the third chip 100c. In some embodiments, the adhesive layer 110 contacts the second chip 100b along an interface that is disposed along a horizontal line that extends through sidewalls of the thermal conductivity layer 120 on the first chip 100a and sidewalls of the third chip 100c.

Figure 13:
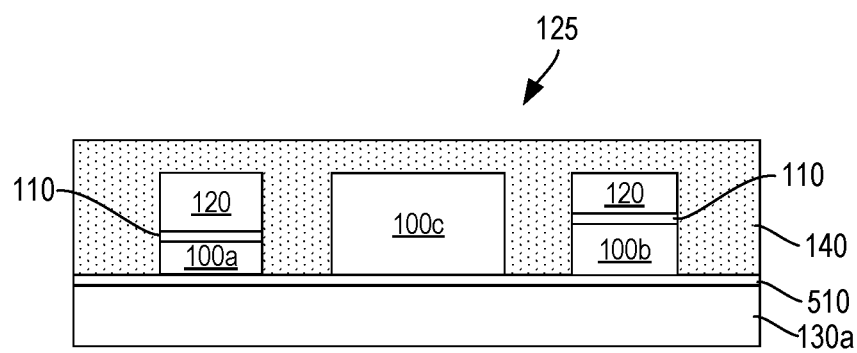

A molding compound 140 is formed over the first substrate 130a and encapsulates the thermal conductivity layer 120, the first chip 100a, the second chip 100b, and the third chip 100c. FIG. 13 is a cross-sectional view of the semiconductor package 125, after the molding compound 140 is formed on the first substrate 130a.

Figure 14:
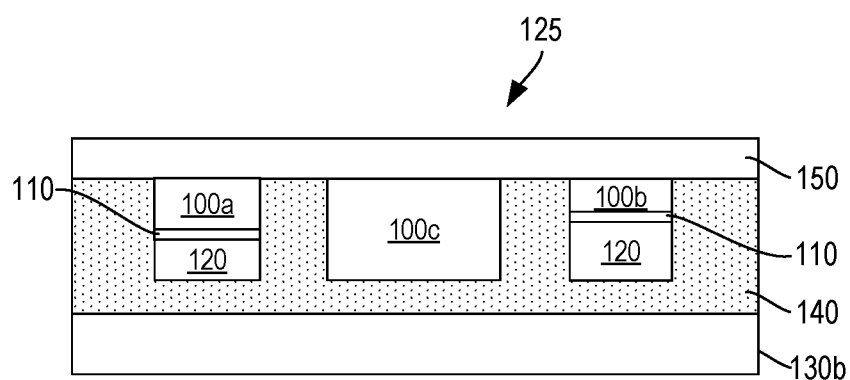

FIG. 14 is a cross-sectional view of the semiconductor package 125 in an inverted position, having been flipped, in accordance with one or more embodiments. The semiconductor package 125 is flipped over so that the molding compound 140 side of the package is bonded to a second substrate 130b. In some embodiments, the second substrate 130b is a wafer carrier. In some embodiments, the semiconductor package 125 is released from the first substrate 130a and the chip side of the semiconductor package 125 is bonded to a package substrate 150. In other embodiments, the first substrate 130a remains attached to the semiconductor package 125 to become the package substrate 150. In some embodiments, package substrate 150 has formed therein any of several additional microelectronic layers such as RDLs (redistribution layers) and microelectronic materials such as conductor materials, semiconductor materials, and dielectric materials.

Figure 15:
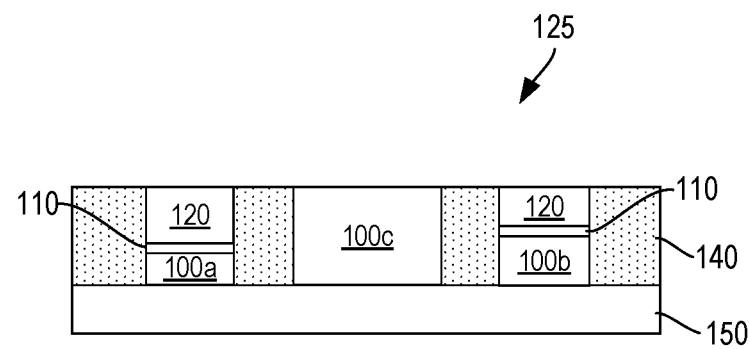

FIG. 15 is a cross-sectional view of the semiconductor package 125 having been released from the second substrate 130b, in accordance with one or more embodiments. After release of the semiconductor package 125 from the second substrate 130b, the molding compound 140 may be planarized.

Planarization of the molding compound 140 removes a part of the molding compound 140, so as to expose top surfaces of the thermal conductivity layer 120 directly over the first chip 100a and the second chip 100b, and to further expose a top surface of the third chip 100c. After the planarization, the thermal conductivity layer 120 directly over the first chip 100a, the thermal conductivity layer 120 directly over the second chip 100b, and the third chip 100c extend to a top surface of the molding compound 140. In some embodiments, a combined height of the first chip 100a and the thermal conductivity layer 120 above the first chip 100a is substantially equal to a height of the third chip 100c. In some embodiments, after planarization is completed, sidewalls of second chip 100b continuously extend between a bottom of the molding compound 140 and a top of the molding compound 140.

In some embodiments, the molding compound 140 is planarized by a chemical mechanical polishing (CMP) process, for example. In other embodiments, the molding compound 140 is planarized by wet chemical etching, dry chemical etching, dry polishing, plasma etching, or other suitable etching processes. In some embodiments, the planarization process used to planarize the molding compound 140 may also remove parts of the thermal conductivity layer 120 directly over the first chip 100a and the second chip 100b, so that the thermal conductivity layer 120 directly over the first chip 100a, the thermal conductivity layer 120 directly over the second chip 100b, and the third chip 100c extend to a top surface of the molding compound 140.

Figure 16:
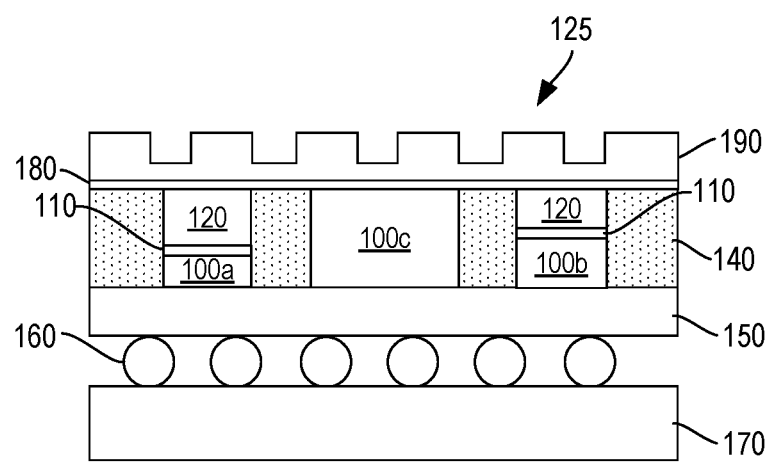

FIG. 16 is a cross-sectional view of the semiconductor package 125 having been mounted onto a board 170, such as a printed circuit board (PCB) by electrical connectors 160, such as ball grid array (BGA). In some embodiments, the electrical connectors 160 comprise lead free solder or the like. The chip side of the semiconductor package 125 is bonded to the package substrate 150. A thermal interface material (TIM) 180 is formed to be in physical contact with top surfaces of the thermal conductivity layer 120 directly over the first chip 100a, the thermal conductivity layer 120 directly over the second chip 100b, the molding compound 140, and the third chip 100c. In some embodiments, a thermal management device 190 such as a heat sink is placed on the TIM 180 to facilitate the dissipation of heat from the first chip 100a, the second chip 100b, and the third chip 100c.

In one or more embodiments, the thermal conductivity layer in a semiconductor package provides a high degree of heat dissipation by providing a thermal path through which thermal energy, or heat that is generated by a chip to be dissipated to the ambient or environment.

In one or more embodiments, use of the thermal conductivity layer allows heat generated by temperature sensitive chips to be effectively and/or efficiently dissipated to the ambient or to a thermal management device to prevent overheating of the chip.

In one or more embodiments, the thermal conductivity layer can function as a mechanical support during molding to minimize molding compound shrinkage and/or warpage.

One aspect of this description relates to a method of forming a semiconductor package includes forming a thermal conductivity layer and attaching the thermal conductivity layer to a chip, the chip having a first surface and a second surface, the thermal conductivity layer being attached to the first surface of the chip, wherein the thermal conductivity layer is configured to provide a path through which heat generated from the chip is dissipated. The method also includes attaching a substrate to the second surface of the chip. The method further includes forming a molding compound above the substrate to encapsulate the chip and the thermal conductivity layer.

Another aspect of this description relates to a semiconductor package that includes a chip attached to a first substrate. The semiconductor package also includes a thermal conductivity layer attached to the chip, wherein the thermal conductivity layer provides a path through which heat generated from the chip is dissipated. The semiconductor package further includes a molding compound formed above the first substrate, the molding compound encapsulating the chip and the thermal conductivity layer.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims and their range of equivalents.

What is claimed is:

1. A semiconductor package structure, comprising:
a first chip attached to a substrate;
a second chip attached to the substrate;
a thermal conductivity layer attached to the first chip;
a molding compound laterally surrounding the first chip, the second chip, and the thermal conductivity layer; and
wherein the thermal conductivity layer has a first thickness along outermost sidewalls of the thermal conductivity layer that contact the molding compound and a second thickness laterally between the outermost sidewalls, the second thickness being smaller than the first thickness.

2. The semiconductor package structure of claim 1, wherein the first chip has a first width and that second chip has a second width that is different than the first width.

3. The semiconductor package structure of claim 1, further comprising:
a second substrate bonded to the substrate by electrical connectors.

4. The semiconductor package structure of claim 1, wherein the thermal conductivity layer is completely confined above an upper surface of the first chip that faces away from the substrate.

5. The semiconductor package structure of claim 1, further comprising:
a plurality of active devices disposed within the substrate.

6. The semiconductor package structure of claim 1, wherein the substrate comprises a plurality of redistribution layers.

7. The semiconductor package structure of claim 1, further comprising:
a thermal management device coupled to an uppermost surface of the molding compound facing away from the substrate, the thermal management device arranged directly over the thermal conductivity layer and the second chip.

8. The semiconductor package structure of claim 1, wherein the thermal conductivity layer has a thermal conductivity between about 3 W/m-K and about 10 W/m-K.

9. The semiconductor package structure of claim 1, wherein the thermal conductivity layer comprises a polymer material having a conductive filler material.

10. A semiconductor package structure, comprising:
a first chip attached to a substrate;
a second chip attached to the substrate;
a thermal conductivity layer disposed on the first chip;
a molding compound laterally surrounding the first chip, the second chip, and the thermal conductivity layer; and
wherein the molding compound vertically extends past a first sidewall of the first chip and wherein the second chip has a second sidewall that vertically extends from a bottommost surface of the molding compound facing the substrate to a topmost surface of the molding compound that faces away from the substrate.

11. The semiconductor package structure of claim 10, wherein the first chip is a different type of chip than the second chip.

12. The semiconductor package structure of claim 10, wherein the first chip is a memory chip, a logic chip, or a processor chip and the second chip is a radio frequency (RF) chip.

13. The semiconductor package structure of claim 10, further comprising:
a third chip attached to the substrate, wherein the third chip has a third height that is between a first height of the first chip and a second height of the second chip.

14. The semiconductor package structure of claim 13, further comprising:
a second thermal conductivity layer disposed on the third chip, wherein the molding compound comprises a sidewall that contacts sidewalls of both the third chip and the second thermal conductivity layer.

15. The semiconductor package structure of claim 13, wherein the molding compound comprises a first segment disposed along a first side of the second chip and a second segment disposed along a second side of the second chip as viewed along a cross-sectional view of the second chip, the first segment being completely separated from the second segment by the second chip as viewed along the cross-sectional view of the second chip.

16. The semiconductor package structure of claim 13, wherein the thermal conductivity layer has a bottommost surface facing the substrate and an upper surface facing away from the substrate, the bottommost surface laterally extending past opposing ends of the upper surface.

17. A semiconductor package structure, comprising:
a first chip attached to a substrate;
a second chip attached to the substrate;
a thermal conductivity layer disposed on the first chip;
a molding compound contacting sidewalls and horizontally extending surfaces of the second chip and the thermal conductivity layer, wherein the molding compound has a substantially equal thickness between the horizontally extending surfaces of the second chip and the thermal conductivity layer and a horizontally extending surface of the molding compound facing away from the substrate;
wherein the thermal conductivity layer comprises a first upper surface and a second upper surface facing away from the substrate, the first upper surface coupled to the second upper surface by a sidewall that is vertically between the first upper surface and the second upper surface; and
wherein the second chip comprises a sidewall that vertically and continuously extends from below the first upper surface of the thermal conductivity layer to above the first upper surface of the thermal conductivity layer.

18. The semiconductor package structure of claim 17, wherein the second chip extends from the substrate to an imaginary line that extends along the horizontally extending surface of the thermal conductivity layer facing away from the substrate, and wherein the imaginary line is parallel to the horizontally extending surface.

19. The semiconductor package structure of claim 17, wherein the second chip extends over the substrate to a first height and the thermal conductivity layer extends over the substrate to a second height that is substantially equal to the first height.

20. The semiconductor package structure of claim 17, wherein the molding compound completely covers the horizontally extending surfaces of both the second chip and the thermal conductivity layer.

* * * * *